(12) United States Patent
Lou

(10) Patent No.: US 12,345,759 B2
(45) Date of Patent: Jul. 1, 2025

(54) GUIDE PLATE STRUCTURE HAVING GUIDE PLATES WITH THROUGH HOLES AND PROBE ARRAY HAVING GUIDE PLATE STRUCTURE

(71) Applicant: XINGR HOLDINGS PTE. LTD., Singapore (SG)

(72) Inventor: Choon Leong Lou, Hsinchu (TW)

(73) Assignee: XINGR HOLDINGS PTE. LTD., Singapore (SG)

( * ) Notice: Subject to any disclaimer, the term of this patent is extended or adjusted under 35 U.S.C. 154(b) by 66 days.

(21) Appl. No.: 17/990,036

(22) Filed: Nov. 18, 2022

(65) Prior Publication Data
US 2024/0036106 A1 Feb. 1, 2024

(30) Foreign Application Priority Data
Jul. 26, 2022 (TW) .................................. 111128025

(51) Int. Cl.
*G01R 31/28* (2006.01)
(52) U.S. Cl.
CPC ................................ *G01R 31/2887* (2013.01)
(58) Field of Classification Search
CPC ............ G01R 1/07307; G01R 1/07314; G01R 1/07371; G01R 31/2887; G01R 1/04; G01R 1/0408; G01R 1/06733; G01R 1/07357; G01R 31/2851; G01R 31/2886
See application file for complete search history.

(56) References Cited

U.S. PATENT DOCUMENTS

| | | | | |
|---|---|---|---|---|
| 4,774,459 A * | 9/1988 | Maelzer | ............ | G01R 1/07371 324/750.25 |
| 5,055,777 A * | 10/1991 | Bonelli | .............. | G01R 1/07357 324/72.5 |
| 5,945,836 A * | 8/1999 | Sayre | ................. | G01R 1/07378 324/755.05 |
| 5,952,843 A * | 9/1999 | Vinh | ................... | G01R 1/07357 324/754.07 |
| 6,292,003 B1 * | 9/2001 | Fredrickson | ......... | G01R 1/0483 324/750.25 |
| 7,786,740 B2 * | 8/2010 | Kister | ................ | G01R 1/07314 324/754.03 |
| 8,907,689 B2 * | 12/2014 | Kister | ................ | G01R 31/2887 324/754.01 |
| 10,859,599 B2 * | 12/2020 | Hayashizaki | ...... | G01R 1/06761 |

(Continued)

FOREIGN PATENT DOCUMENTS

| | | |
|---|---|---|
| CN | 107580681 B | 6/2020 |
| EP | 2110673 A1 * | 10/2009 |
| JP | 2009300391 A | 12/2009 |

(Continued)

*Primary Examiner* — Vinh P Nguyen
(74) *Attorney, Agent, or Firm* — Muncy, Geissler, Olds & Lowe, P.C.

(57) ABSTRACT

The present disclosure provides a guide plate structure and a probe array. The probe array includes a first probe, a second probe and a first guide plate. The first and second probes have different configurations in respect of the probe array. The first guide plate includes a first through hole and a second through hole. The first through hole receives the first probe. The second through hole receives the second probe. The first and second through holes have different configurations in respect of the guide plate.

6 Claims, 14 Drawing Sheets

(56) References Cited

U.S. PATENT DOCUMENTS

2018/0052190 A1    2/2018  Perego et al.

FOREIGN PATENT DOCUMENTS

| JP | 2013029504 A   |   | 2/2013 |
| --- | --- | --- | --- |
| JP | 2020502519 A   |   | 1/2020 |
| WO | WO201608520 A1 | * | 7/2016 |
| WO | 2023157900 A1  |   | 8/2023 |

* cited by examiner

GUIDE PLATE STRUCTURE HAVING GUIDE PLATES WITH THROUGH HOLES AND PROBE ARRAY HAVING GUIDE PLATE STRUCTURE

CROSS REFERENCE TO RELATED APPLICATION

This application claims priority of Taiwan application No. 111128025 filed on Jul. 26, 2022, which is incorporated by reference in its entirety.

TECHNICAL FIELD

The present disclosure relates to a guide plate structure and a probe array and, more particularly, to a guide plate structure with different through holes and a probe array characterized by the guide plate structure.

DISCUSSION OF THE BACKGROUND

Prior art requires a wide variety of IC chips to undergo electrical tests during their manufacturing processes. When target areas on an object under test (for example, a chip-on-wafer-on-substrate, or CoWoS) are of different thicknesses, a probe array with a single probe structure is unable to come into consistent contact with the target areas of the object under test.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

A guide plate structure according to an embodiment of the present disclosure includes a first guide plate. The first guide plate includes: a first through hole for receiving a first probe; and a second through hole for receiving a second probe. Configurations of the first probe and the second probe are different. Configurations of the first through hole and the second through hole are different.

In some embodiments, a length of the second probe is less than a length of the first probe, and a diameter of the second through hole is greater than a diameter of the first through hole.

In some embodiments, the guide plate structure further includes a second guide plate. The second guide plate includes: a third through hole for receiving the first probe; and a fourth through hole for receiving the second probe. A diameter of the third through hole is greater than a diameter of the fourth through hole.

In some embodiments, an end of the first probe is configured to contact an object under test, and a distance between the first guide plate and the end of the first probe is less than a distance between the second guide plate and the end of the first probe.

In some embodiments, the length of the second probe is less than the length of the first probe, and the first through hole and the second through hole are conical and taper in different directions.

In some embodiments, the end of the first probe and an end of the second probe are configured to contact an object under test. The first through hole is tapered toward the end of the first probe. The second through hole is tapered away from the end of the second probe.

In some embodiments, the first guide plate has a cross section, such that a portion of the first through hole in the cross section or a portion of the second through hole in the cross section has a square shape, a rectangle shape, a trapezoid shape or a step shape.

A guide plate structure according to another embodiment of the disclosure includes a guide plate. The guide plate includes: a first through hole for receiving a first probe, wherein the first probe is configured to probe a first block of an object under test; and a second through hole for receiving a second probe, wherein the second probe is configured to probe a second block of an object under test. Configurations of the first through hole and the second through hole are different, wherein displacement of the guide plate relative to the first probe and the second probe causes the first probe to shift and touch the first block and causes the second probe to shift and touch the second block.

A probe array according to another embodiment of the disclosure includes a first probe, a second probe and a first guide plate. Configurations of the first probe and the second probe in respect of the probe array are different. The first guide plate includes: a first through hole for receiving the first probe; and a second through hole for receiving the second probe. Configurations of the first through hole and the second through hole in respect of the first guide plate are different.

In some embodiments, a length of the second probe is less than a length of the first probe, and a diameter of the second through hole is greater than a diameter of the first through hole.

In some embodiments, the probe array further includes a second guide plate. The second guide plate includes: a third through hole for receiving the first probe; and a fourth through hole for receiving the second probe. A third diameter of the third through hole is greater than a fourth diameter of the fourth through hole.

In some embodiments, an end of the first probe is configured to contact an object under test. A distance between the first guide plate and the end of the first probe is less than a distance between the second guide plate and the end of the first probe.

In some embodiments, the length of the second probe is less than the length of the first probe, and the first through hole and the second through hole are conical and taper in different directions.

In some embodiments, the end of the first probe and an end of the second probe are configured to contact an object under test. The first through hole is tapered toward the end of the first probe, and the second through hole is tapered away from the end of the second probe.

In some embodiments, the first guide plate has a cross section, such that a portion of the first through hole in the cross section or a portion of the second through hole in the cross section has a square shape, a rectangle shape, a trapezoid shape or a step shape.

The technical features and advantages of the present disclosure are comprehensively provided in the description above, so as to enable a better understanding of the present disclosure from details given in the description below. Additional technical features and advantages of the subject matter of the claims of the present disclosure are provided in the description below. A person skilled in the art of the present disclosure should understand that it would be easy to implement objects same as those of the present disclosure by modifying or designing other structures or processes on the basis of the concept and specific embodiments disclosed in the description below. Moreover, a person skilled in the art should understand that such equivalent arrangements are within the spirit and scope of the present disclosure as defined by the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1A:
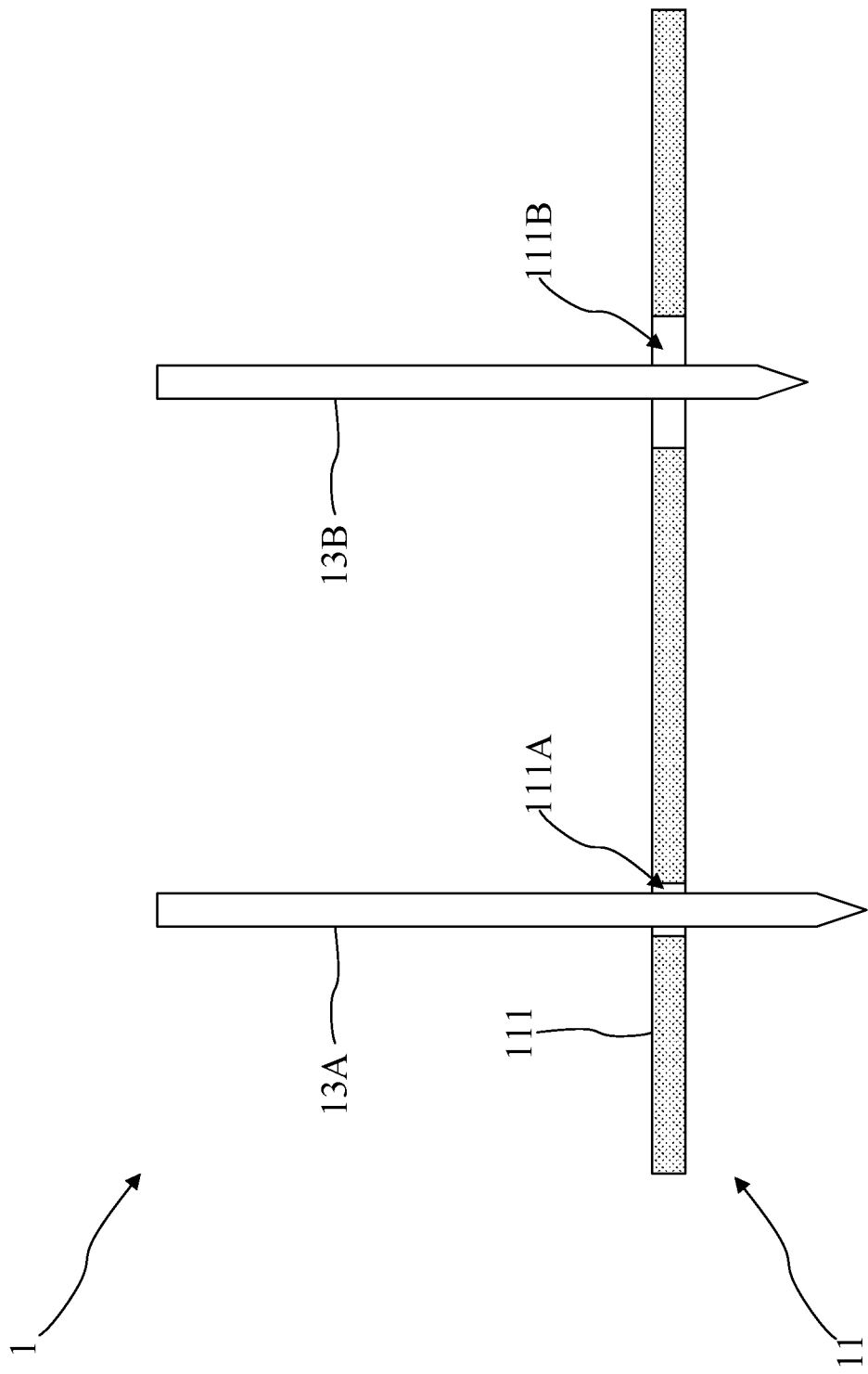
FIGS. 1A to 1B are schematic views of a probe array according to some embodiments of the disclosure.

The description of the present disclosure below is accompanied by drawings to illustrate embodiments of the present disclosure. However, it should be noted that the present disclosure is not limited to such embodiments. Moreover, the embodiments below can be appropriately integrated into other embodiments.

The terms "embodiment," "an embodiment," "exemplary embodiment," "other embodiment" and "another embodiment" mean that the embodiments described in the present disclosure can include specific features, structures or characteristics; however, it should be noted that not every embodiment needs to include such specific features, structures or characteristics. In addition, repeated use of the expression "in the embodiment" or "of the embodiment" does not necessarily refer to the same embodiment, although it may.

To fully understand the present disclosure, steps and structures are described in detail below. It should be obvious that implementation of the present disclosure does not limit specific details generally known to persons skilled in the art. Further, generally known structures and steps are not described in detail, so as to prevent unnecessary limitation to the present disclosure. Preferred embodiments of the present disclosure are described in detail below. However, apart from the detailed description, the present disclosure can also be extensively applied in other embodiments. The scope of the present disclosure is not limited to the contents given in the detailed description, but is to be defined in accordance with the appended claims.

It should be understood that the disclosure below provides various different embodiments or implementation examples for implementing different features of the present disclosure. Specific embodiments or implementation examples of components and arrangements are set forth below to simplify the present disclosure. It should be noted that such details are exemplary and are not to be intended to be restrictive. For example, a size of an element is not limited to a disclosed range or value, but can depend on an expected property of a manufacturing condition and/or device. Moreover, in the description below, a first feature described as formed "on" or "above" a second feature may include embodiments in which the first feature and the second feature are formed in a direct contact manner, and may also include embodiments in which an additional feature is formed between the first feature and the second feature in a way that the first feature and the second feature may not be in direct contact. For simplicity and clarity, various features may be depicted according to different scales. In the accompanying drawings, some layers or features are omitted for the sake of simplicity.

Moreover, for better illustration, terms of relative spatial relations such as "beneath," "below," "lower," "above" and "upper" may be used to describe a relation of one element or feature relative to another element or feature. Such terms of relative spatial relation are intended to cover different orientations of the element during use or operation in addition to the orientation depicted in the drawings. An apparatus may be orientated otherwise (rotated 90 degrees or having another orientation) and the descriptive terms of the relative spatial relations used in the literature may also be similarly and correspondingly interpreted.

A guide plate structure according to an embodiment of the present disclosure includes a guide plate. The guide plate includes through holes, wherein the through holes have different configurations and are configured to receive probes, wherein the probes have different configurations in respect of an array of the probes. When the guide plate moves relative to the probes, the probes shift, such that the probes disposed in the through holes are in contact with blocks on an object under test, respectively, wherein the blocks have different thicknesses.

Referring to FIG. 1A, which is a schematic view of a probe array 1 according to some embodiments of the disclosure. The probe array 1 includes a guide plate structure 11, a first probe 13A and a second probe 13B. The guide plate structure 11 includes a first guide plate 111. The first guide plate 111 includes a first through hole 111A and a second through hole 111B. The first through hole 111A receives the first probe 13A. The second through hole 111B receives the second probe 13B. In some embodiments, the first probe 13A and the second probe 13B have different configurations (for example, length, shape, arrangement, and position in the corresponding through hole). In some embodiments, the first through hole 111A and the second through hole 1111B have different configurations (for example, diameter and shape).

Figure 1B:
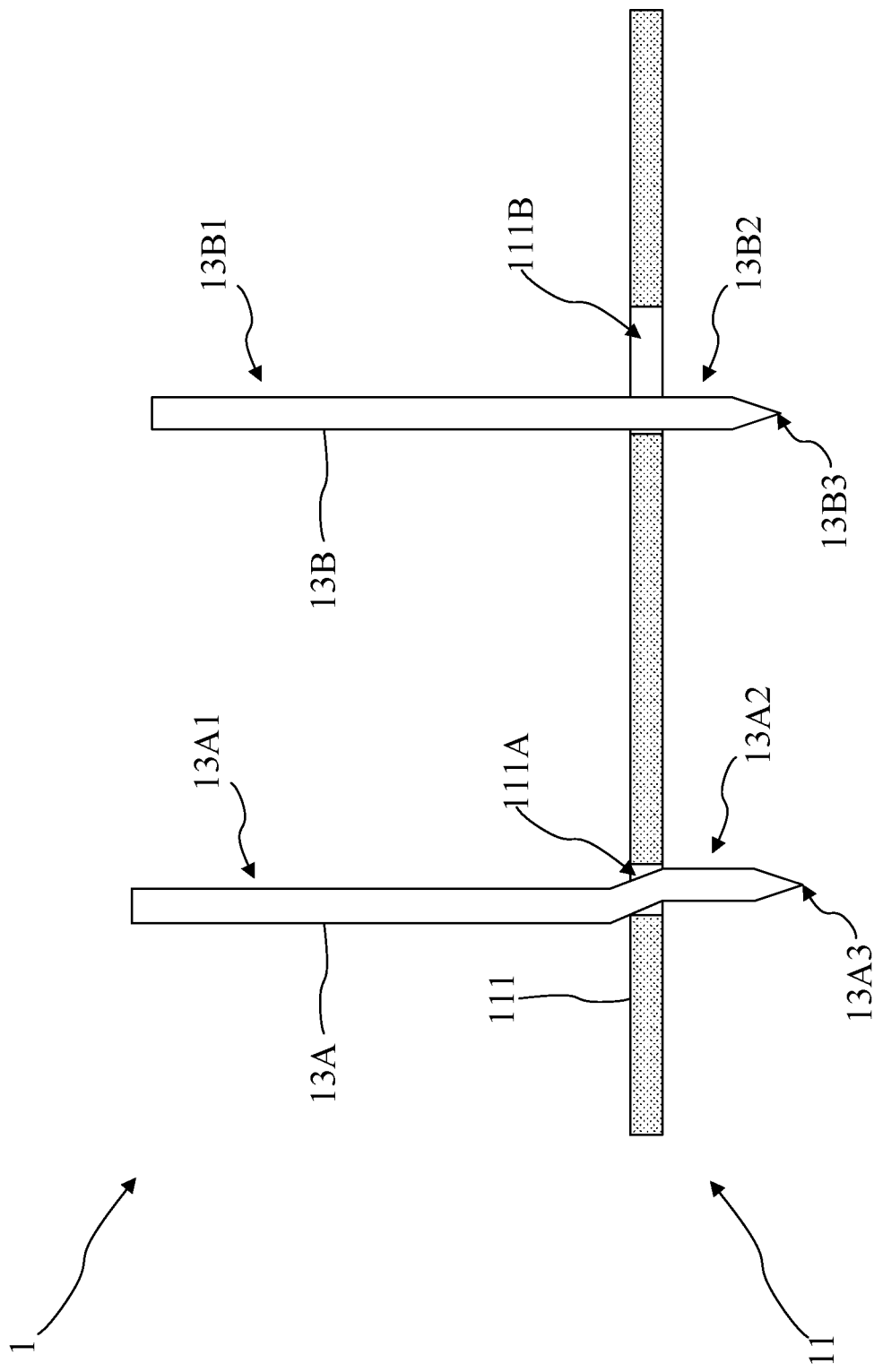

Referring to FIG. 1B, which is a schematic view of the guide plate structure 11 for guiding a probe according to some embodiments of the disclosure. Ranges of motion of an upper portion 13A1 of the first probe 13A and an upper portion 13B1 of the second probe 13B are restricted (by, for example, a mechanism (not shown)). The first through hole 111A and the second through hole 111B have different configurations; thus, when the first guide plate 111 moves (for example, laterally) relative to the first probe 13A and the second probe 13B, a lower portion 13A2 of the first probe 13A and a lower portion 13B2 of the second probe 13B shift together with the first through hole 111A and the second through hole 111B, respectively, because of the motion of the first guide plate 111.

In some embodiments, the first guide plate 111 has a thickness. The first through hole 111A and the second through hole 111B have different configurations, and the displacement of the first guide plate 111 causes an offset of the lower portion 13A2 of the first probe 13A to differ from an offset of the lower portion 13B2 of the second probe 13B, thereby causing a difference in height between an end 13A3 of the first probe 13A and an end 13B3 of the second probe 13B. Therefore, the difference in height between the end 13A3 of the first probe 13A and the end 13B3 of the second probe 13B can be controlled by: (1) adjusting the thickness of the first guide plate 111; (2) controlling the displacement of the first guide plate 111 relative to the first probe 13A and the second probe 13B; (3) adjusting the configurations of the first through hole 111A and the second through hole 111B; or any combination of (1) to (3).

Therefore, when the end 13A3 of the first probe 13A and the end 13B3 of the second probe 13B are configured to contact different target blocks defined on a single object under test, wherein the target blocks have different thicknesses, the difference in height between the end 13A3 of the first probe 13A and the end 13B3 of the second probe 13B is controlled to cause the end 13A3 of the first probe 13A and the end 13B3 of the second probe 13B to have a same contact probe pressure when simultaneously coming into contact with the different target blocks defined on the same object under test and having different thicknesses. Thus, by controlling the difference in height between the end 13A3 of the first probe 13A and the end 13B3 of the second probe 13B, the end 13A3 of the first probe 13A and the end 13B3 of the second probe 13B can be in consistent contact with the target blocks on the same object under test.

Figure 2A:
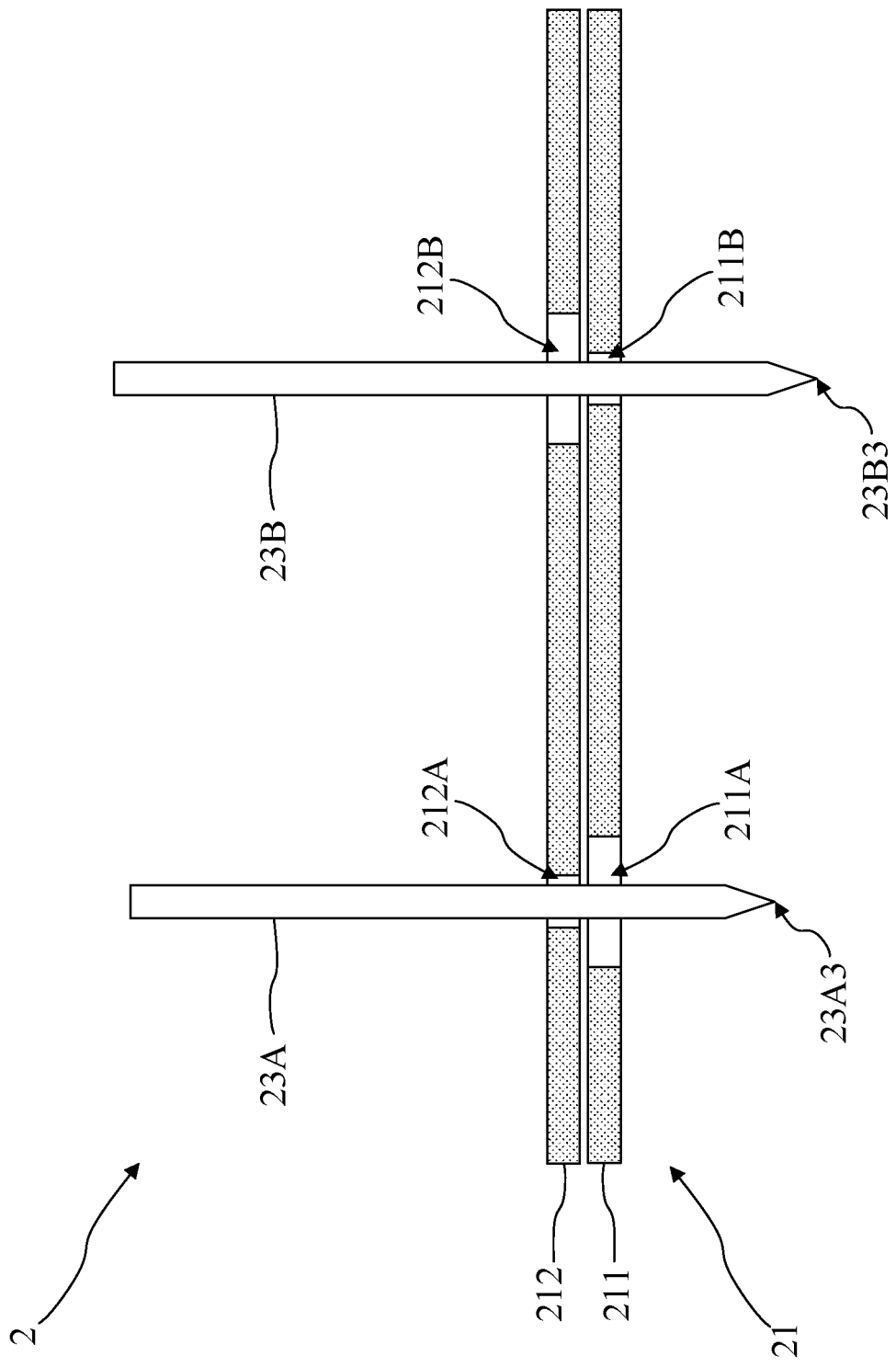
FIGS. 2A to 2D are schematic views of a probe array according to some embodiments of the disclosure.

Referring to FIG. 2A, 'which is a schematic view of a probe array 2 according to some embodiments of the disclosure. The probe array 2 includes a guide plate structure 21, a first probe 23A and a second probe 23B. The guide plate structure 21 includes a first guide plate 211 and a second guide plate 212. The first guide plate 211 includes two through holes 211A and 211B. The second guide plate 212 includes two through holes 212A and 212B. The through hole 211A of the first guide plate 211 and the through hole 212A of the second guide plate 212 receive the first probe 23A. The through hole 211B of the first guide plate 211 and the through hole 212B of the second guide plate 212 receive the second probe 23B.

In some embodiments, an end 23A3 of the first probe 23A and an end 23B3 of the second probe 23B are configured to contact an object under test (not shown). A distance between the first guide plate 211 and the end 23A3 of the first probe 23A is less than a distance between the second guide plate 212 and the end 23A3 of the first probe 23A. A distance between the first guide plate 211 and the end 23B3 of the second probe 23B is less than a distance between the second guide plate 212 and the end 23B3 of the second probe 23B. Thus, the first guide plate 211 is disposed between the second guide plate 212 and the end 23A3 of the first probe 23A (or the end 23B3 of the second probe 23B).

In some embodiments, the first probe 23A and the second probe 23B have different configurations (for example, length, shape, arrangement, and position in the corresponding through hole). The through hole 211A and the through hole 211B have different configurations (for example, diameter and shape). The through hole 212A and the through hole 212B have different configurations (for example, diameter and shape). In some embodiments, a length of the first probe 23A is less than a length of the second probe 23B, a diameter of the through hole 211A is greater than a diameter of the through hole 2111B, and a diameter of the through hole 212A is less than a diameter of the through hole 212B. In some embodiments, each of the first guide plate 211 and the second guide plate 212 has a cross section (e.g., along thickness direction), such that a portion of each of the through holes 211A, 211B, 212A and 212B has a square shape or a rectangle shape. However, the disclosure is not limited thereto.

Figure 2B:
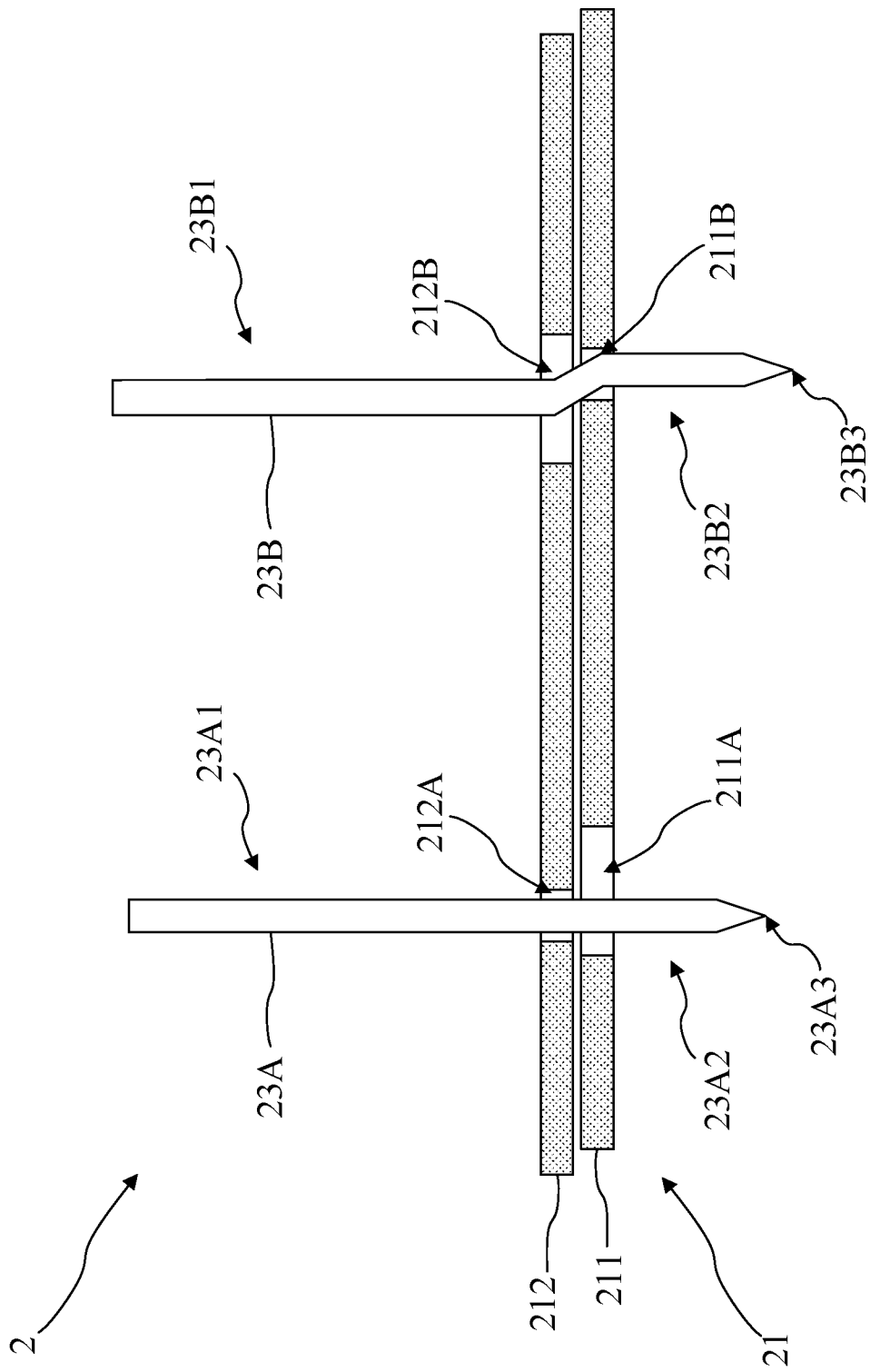

Referring to FIG. 2B, which is a schematic view of the guide plate structure 21 for guiding a probe according to some embodiments of the disclosure. Ranges of motion of an upper portion 23A1 of the first probe 23A and an upper portion 23B1 of the second probe 23B are restricted (by, for example, a mechanism (not shown)). When the first guide plate 211 moves (for example, laterally) relative to the first probe 23A and the second probe 23B, the through hole 211B causes a lower portion 23B2 of the second probe 23B to shift, because the diameter of the through hole 211B is small.

In some embodiments, the first guide plate 211 has a thickness, and the diameter of the through hole 211A is greater than the diameter of the through hole 2111B, and thus the displacement of the first guide plate 211 causes the lower portion 23B2 of the second probe 23B to shift, leading to a change in a difference in height between the end 23A3 of the first probe 23A and the end 23B3 of the second probe 23B. Therefore, the difference in height between the end 23A3 of the first probe 23A and the end 23B3 of the second probe 23B can be controlled by: (1) adjusting the thickness of the first guide plate 211; (2) controlling the displacement of the first guide plate 211 relative to the first probe 23A and the second probe 23B; (3) adjusting the diameters of the through hole 211A and the through hole 211B; or any combination of (1) to (3).

Figure 2C:
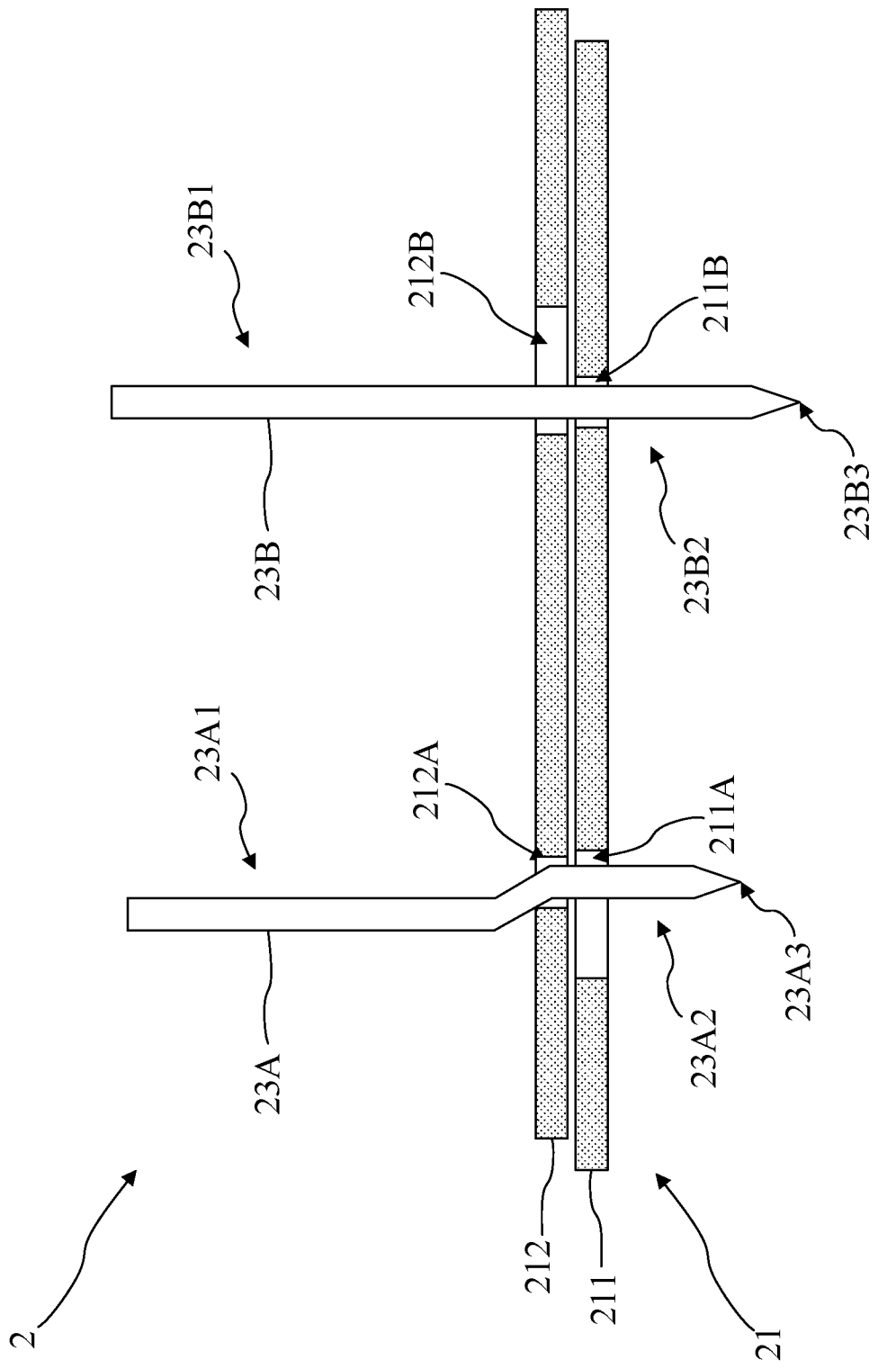

Referring to FIG. 2C, which is a schematic view of the guide plate structure 21 for guiding a probe according to some embodiments of the disclosure. When the second guide plate 212 moves (for example, laterally) relative to the first probe 23A and the second probe 23B, the through hole 212A causes the lower portion 23A2 of the first probe 23A to shift, because the diameter of the through hole 212A is small.

In some embodiments, the second guide plate 212 has a thickness, and the diameter of the through hole 212A is less than the diameter of the through hole 212B; therefore, the displacement of the second guide plate 212 causes the lower portion 23A2 of the first probe 23A to shift, leading to a change in the difference in height between the end 23A3 of the first probe 23A and the end 23B3 of the second probe 23B. Therefore, the difference in height between the end 23A3 of the first probe 23A and the end 23B3 of the second probe 23B can be controlled by: (1) adjusting the thickness of the second guide plate 212; (2) controlling the displacement of the second guide plate 212 relative to the first probe 23A and the second probe 23B; (3) adjusting the diameters of the through hole 212A and the through hole 212B; or any combination of (1) to (3).

Figure 2D:
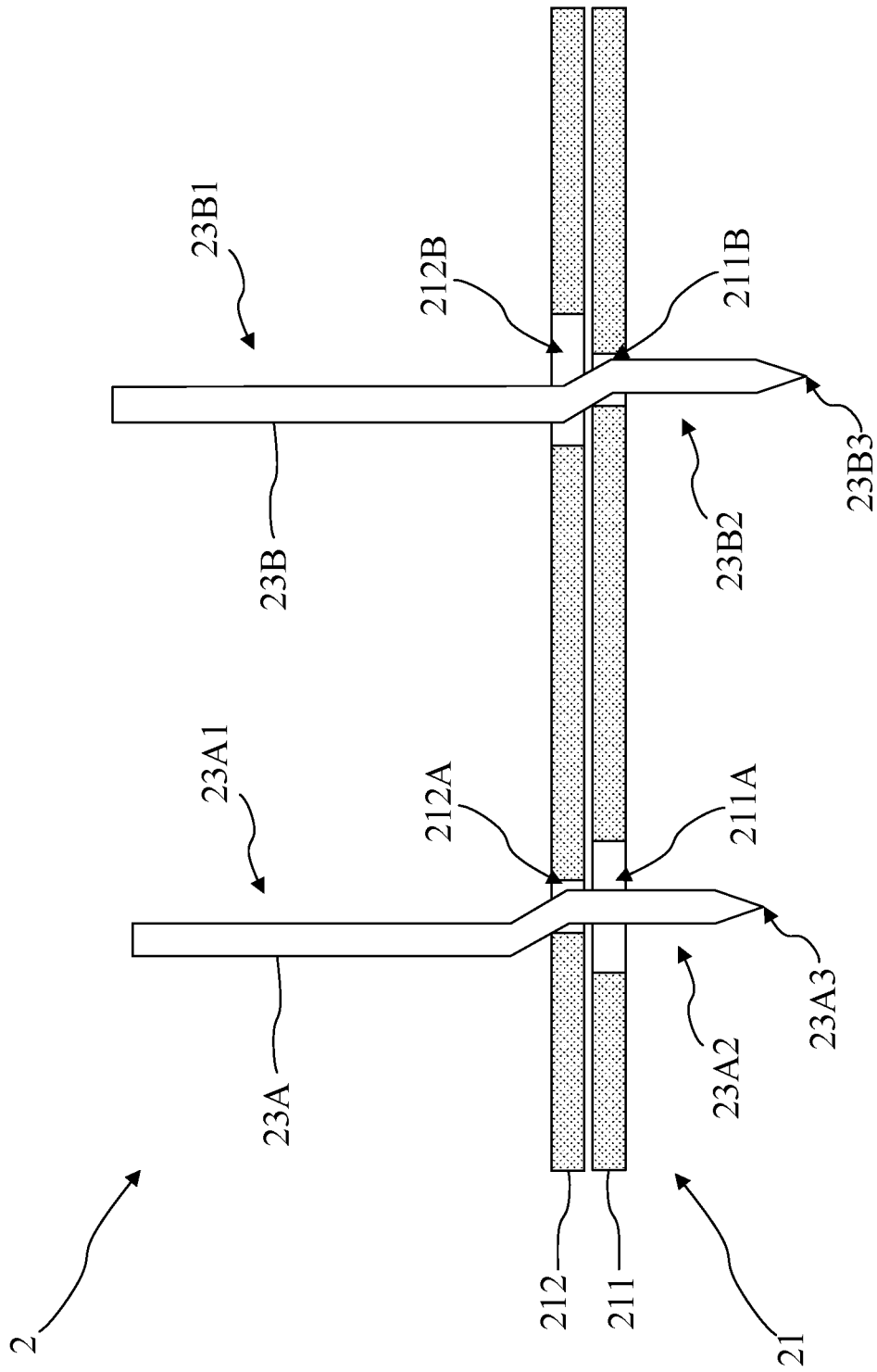

Referring to FIG. 2D, which is a schematic view of the guide plate structure 21 for guiding a probe according to some embodiments of the disclosure. When the first guide plate 211 and the second guide plate 212 move (for example, laterally) relative to the first probe 23A and the second probe 23B, the through hole 212A causes the lower portion 23A2 of the first probe 23A to shift, and the through hole 211B causes the lower portion 23B2 of the second probe 23B to shift.

In some embodiments, each of the first guide plate 211 and the second guide plate 212 has a thickness, the diameter of the through hole 211A is greater than the diameter of the through hole 2111B, and the diameter of the through hole 212A is less than the diameter of the through hole 212B. Therefore, the displacement of the first guide plate 211 and the second guide plate 212 cause the lower portion 23A2 of the first probe 23A and the lower portion 23B2 of the second probe 23B to shift, thereby keeping the distance between the end 23A3 of the first probe 23A and the through hole 212A equal to the distance between the end 23B3 of the second probe 23B and the through hole 211B.

Therefore, it is feasible to keep the distance between the end 23A3 of the first probe 23A and the through hole 212A equal to the distance between the end 23B3 of the second probe 23B and the through hole 211B by: (1) adjusting the thicknesses of the first guide plate 211 and the second guide plate 212; (2) controlling the displacement of the first guide plate 211 and the second guide plate 212 relative to the first probe 23A and the second probe 23B; (3) adjusting the diameters of the through holes 211A, 211B, 212A and 212B; or any combination of (1) to (3).

Therefore, when the end 23A3 of the first probe 23A and the end 23B3 of the second probe 23B are configured to contact different target blocks defined on a single object under test wherein the target blocks have different thicknesses, the end 23A3 of the first probe 23A and the end 23B3 of the second probe 23B can have a same contact probe pressure when simultaneously coming into contact with the different target blocks on the same object under test and having different thicknesses by: (1) controlling the difference in height between the end 23A3 of the first probe 23A and the end 23B3 of the second probe 23B; or (2) keeping the distance between the end 23A3 of the first probe 23A and the through hole 212A equal to the distance between the end 23B3 of the second probe 23B and the through hole 211B.

Thus, by controlling the aforesaid configurations of the end 23A3 of the first probe 23A and the end 23B3 of the second probe 23B, the end 23A3 of the first probe 23A and the end 23B3 of the second probe 23B can be in consistent contact with the target blocks defined on the same object under test and having different thicknesses.

Figure 3A:
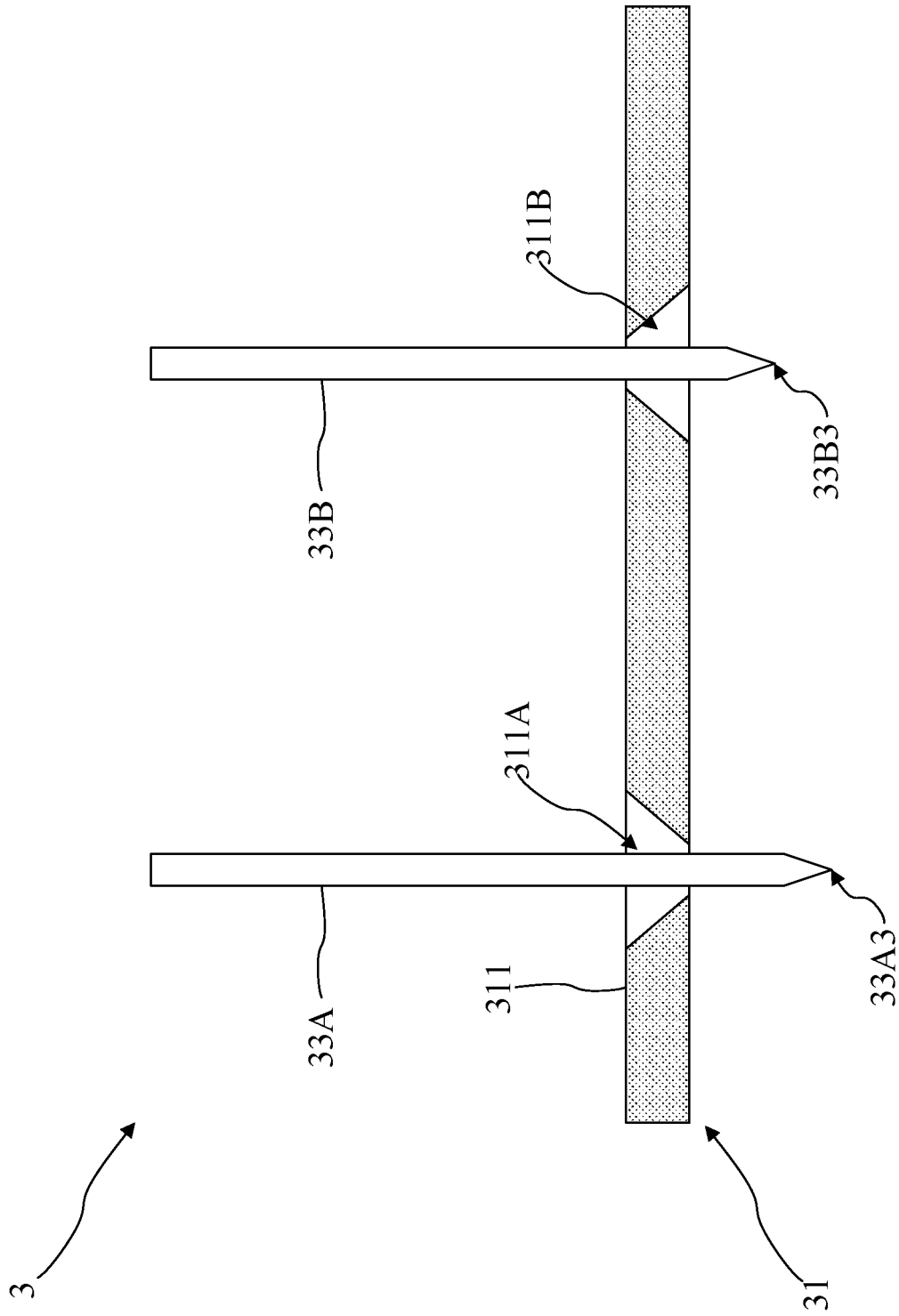
FIGS. 3A to 3B are schematic views of a probe array according to some embodiments of the disclosure.

Referring to FIG. 3A, which is a schematic view of a probe array 3 according to some embodiments of the disclosure. The probe array 3 includes a guide plate structure 31, a first probe 33A and a second probe 33B. The guide plate structure 31 includes a first guide plate 311. The first guide plate 311 includes a first through hole 311A and a second through hole 311B. The first through hole 311A receives the first probe 33A. The second through hole 311B receives the second probe 33B.

In some embodiments, an end 33A3 of the first probe 33A and an end 33B3 of the second probe 33B are configured to contact an object under test (not shown). The first probe 33A and the second probe 33B have different configurations (for example, length, shape, arrangement, and position in the corresponding through hole). The first through hole 311A and the second through hole 311B have different configurations (for example, diameter and shape). In some embodiments, a length of the first probe 33A is greater than a length of the second probe 33B, and the first through hole 311A and the second through hole 311B are conical. The conical first through hole 311A tapers toward the end 33A3 of the first probe 33A. The conical second through hole 311B tapers away from the end 33B3 of the second probe 33B. In some embodiments, each of the first guide plate 311 and the second guide plate 312 has a cross section (e.g., along thickness direction), such that a portion of each of the first through hole 311A and the second through hole 311B in the cross section has a trapezoid shape. However, the disclosure is not limited thereto.

Figure 3B:
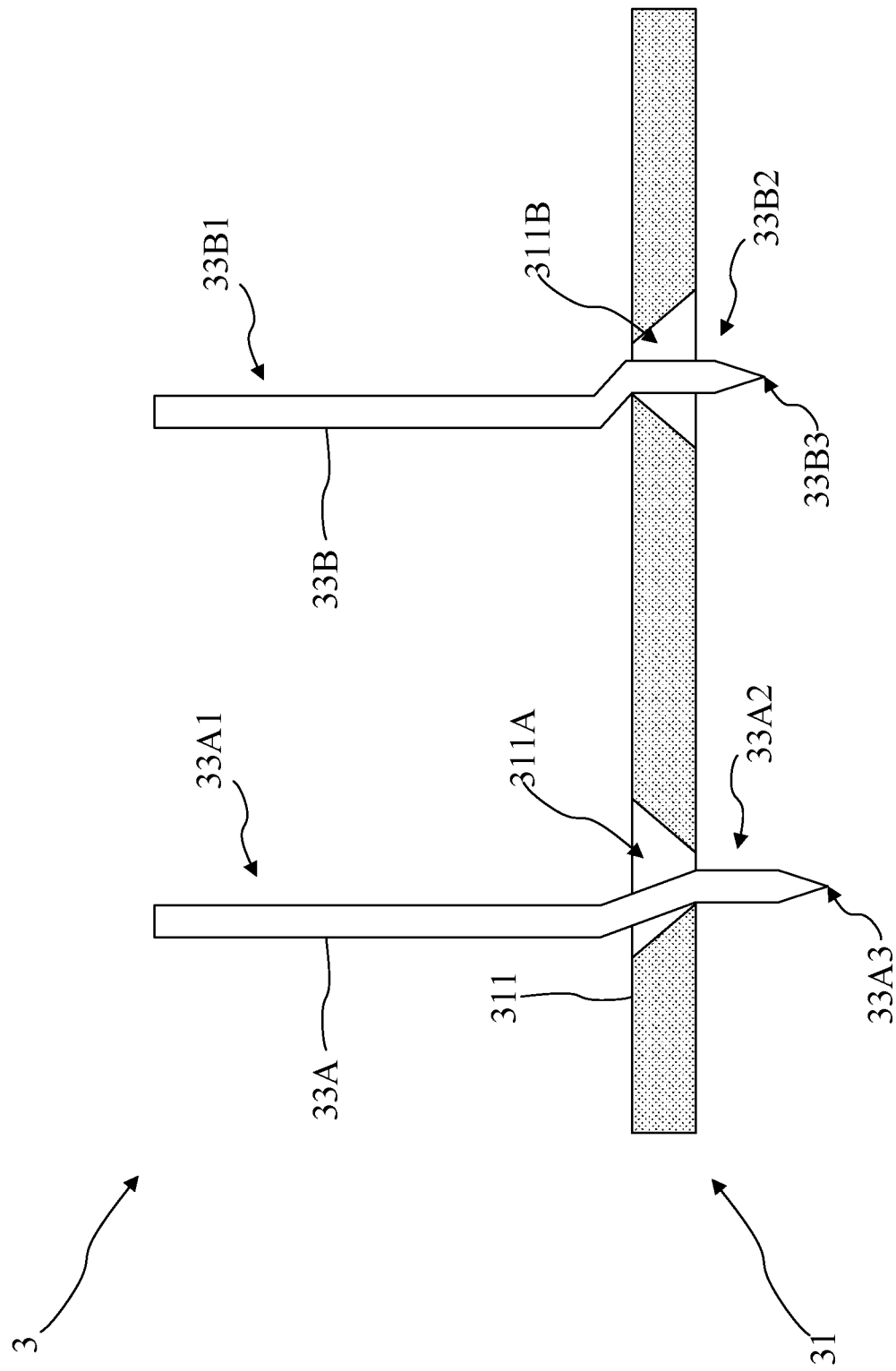

Referring to FIG. 3B, which is a schematic view of the guide plate structure 31 for guiding a probe according to some embodiments of the disclosure. Ranges of motion of an upper portion 33A1 of the first probe 33A and an upper portion 33B1 of the second probe 33B are restricted (by, for example, a mechanism (not shown)). When the first guide plate 311 moves (for example, laterally) relative to the first probe 33A and the second probe 33B, the first through hole 311A and the second through hole 311B cause a lower portion 33A2 of the first probe 33A and a lower portion 33B2 of the second probe 33B, respectively, to shift.

In some embodiments, the first guide plate 311 has a thickness, and the first through hole 311A and the second through hole 311B have different conical configurations; therefore, the displacement of the first guide plate 311 causes the lower portion 33A2 of the first probe 33A and the lower portion 33B2 of the second probe 33B to shift, so as to keep a shortest distance between the end 33A3 of the first probe 33A and the through hole 311A equal to a shortest distance between the end 33B3 of the second probe 33B and the through hole 3111B. Therefore, it is feasible to ensure that the shortest distance between the end 33A3 of the first probe 33A and the through hole 311A is equal to the shortest distance between the end 33B3 of the second probe 33B and the through hole 311B by: (1) adjusting the thickness of the first guide plate 311; (2) controlling the displacement of the first guide plate 311 relative to the first probe 33A and the second probe 33B; (3) adjusting the configurations of the first through hole 311A and the second through hole 3111B; or any combination of (1) to (3).

Therefore, when the end 33A3 of the first probe 33A and the end 33B3 of the second probe 33B are configured to contact different target blocks defined on a single object under test, wherein the target blocks have different thicknesses, the end 33A3 of the first probe 33A and the end 33B3 of the second probe 33B have a same contact probe pressure while simultaneously in contact with the target blocks, by keeping the shortest distance between the end 33A3 of the first probe 33A and the through hole 311A equal to the shortest distance between the end 33B3 of the second probe 33B and the through hole 3111B. Thus, by keeping the shortest distance between the end 33A3 of the first probe 33A and the through hole 311A equal to the shortest distance between the end 33B3 of the second probe 33B and the through hole 311B, the end 33A3 of the first probe 33A and the end 33B3 of the second probe 33B are in consistent contact with the target blocks on the object under test.

Figure 4A:
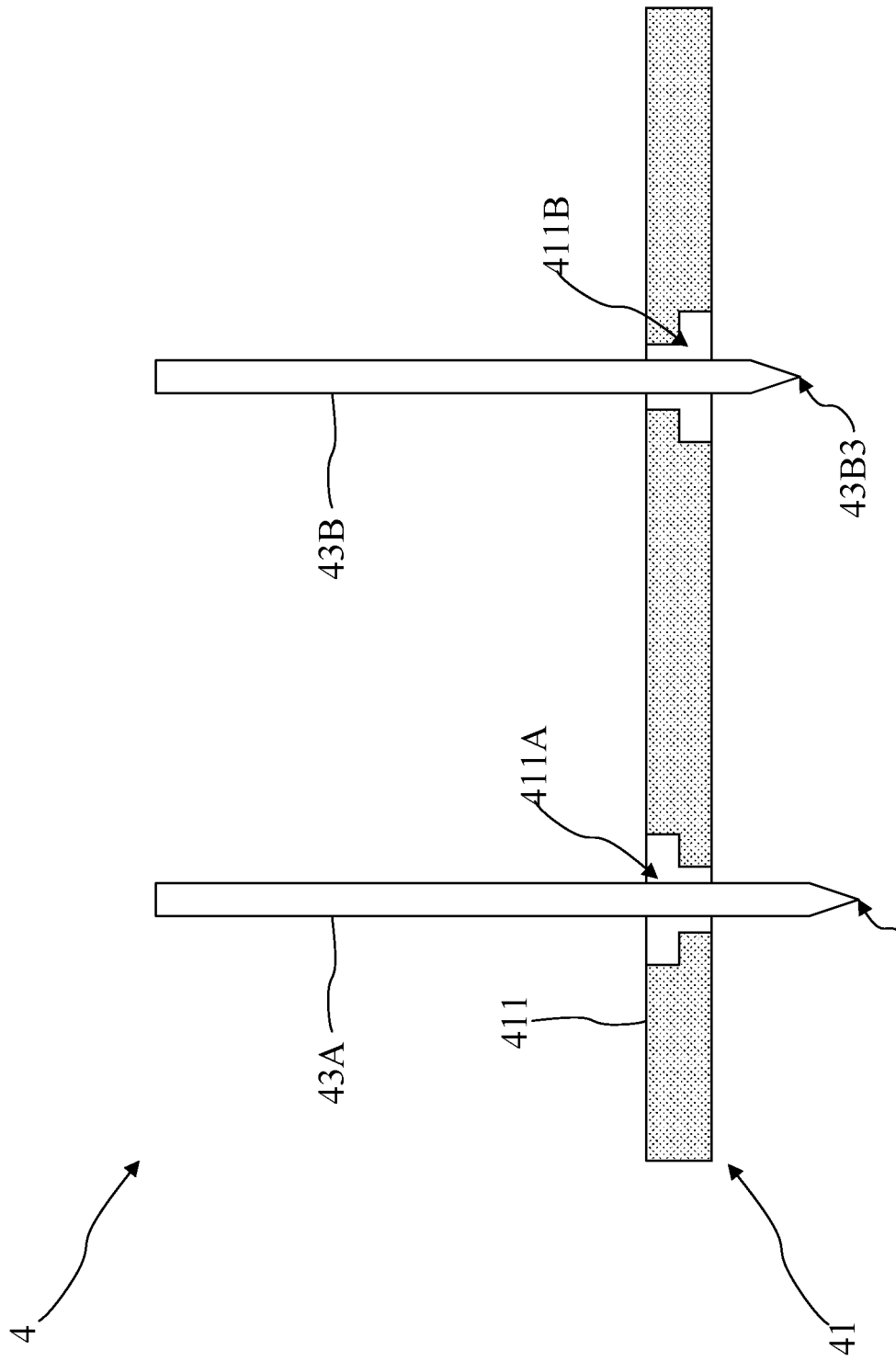
FIGS. 4A to 4B are schematic views of a probe array according to some embodiments of the disclosure.

Referring to FIG. 4A, which is a schematic view of a probe array 4 according to some embodiments of the disclosure. The probe array 4 includes a guide plate structure 41, a first probe 43A and a second probe 43B. The guide plate structure 41 includes a first guide plate 411. The first guide plate 411 includes a first through hole 411A and a second through hole 4111B. The first through hole 411A receives the first probe 43A. The second through hole 411B receives the second probe 43B.

In some embodiments, an end 43A3 of the first probe 43A and an end 43B3 of the second probe 43B are configured to contact an object under test (not shown). The first probe 43A and the second probe 43B have different configurations (for example, length, shape, arrangement, and position in the corresponding through hole). The first through hole 411A and the second through hole 411B have different configurations (for example, diameter and shape). In some embodiments, a length of the first probe 43A is greater than a length of the second probe 43B, and both the first through hole 411A and the second through hole 411B have a step shape. The step shape of the first through hole 411A tapers toward the end 43A3 of the first probe 43A, and the step shape of the second through hole 411B tapers away from the end 43B3 of the second probe 43B. In some embodiments, the first guide plate 411 and second guide plate 412 each have a cross section (e.g., along thickness direction), such that a portion of each of the first through hole 411A and the second through hole 411B in the cross section has a step shape. However, the disclosure is not limited thereto.

Figure 4B:
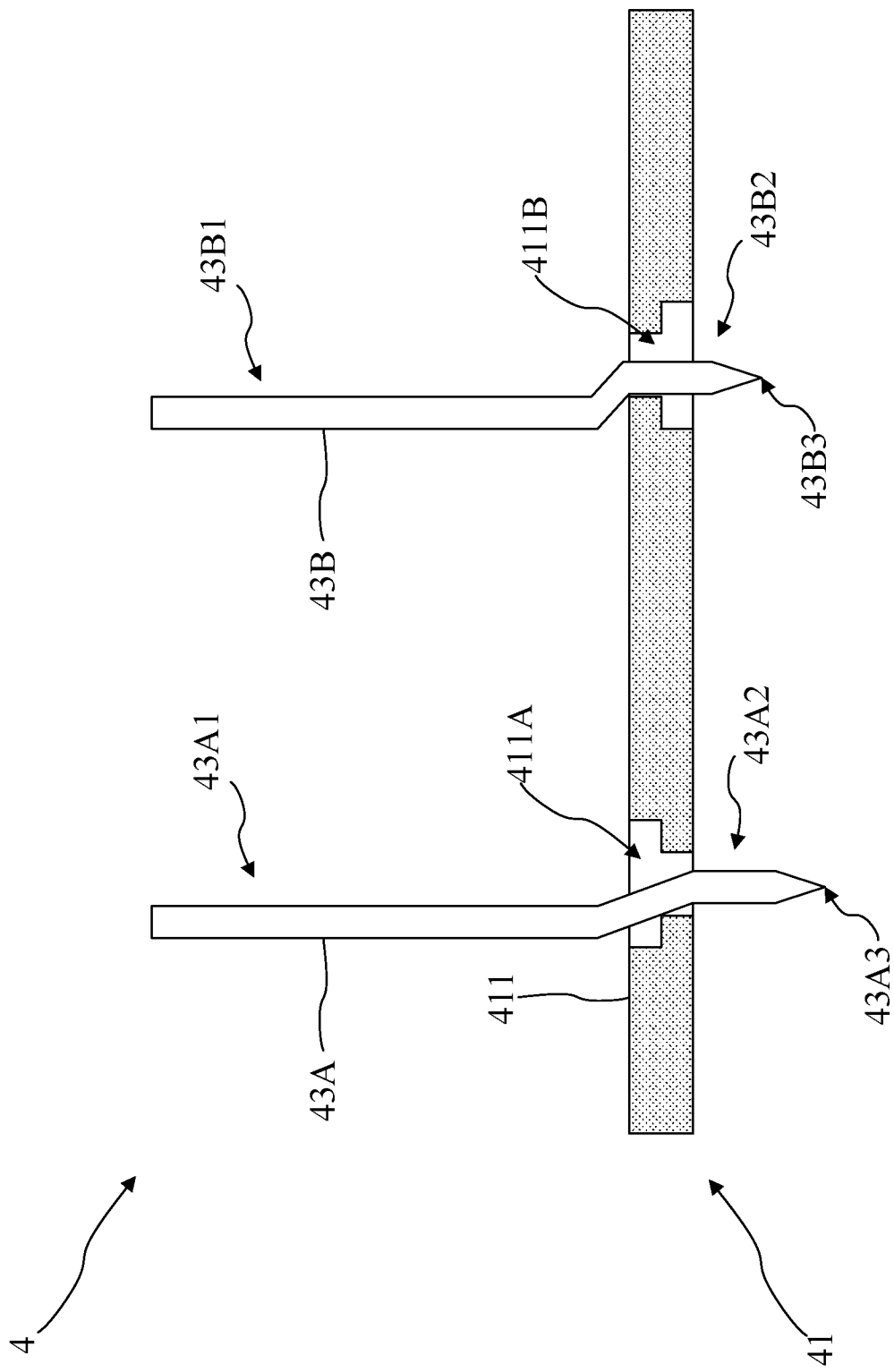

Referring to FIG. 4B, which is a schematic view of the guide plate structure 41 for guiding a probe according to some embodiments of the disclosure. Ranges of motion of an upper portion 43A1 of the first probe 43A and an upper portion 43B1 of the second probe 43B are restricted (for example, by a mechanism (not shown)). When the first guide plate 411 moves (for example, laterally) relative to the first probe 43A and the second probe 43B, the first through hole 411A and the second through hole 411B cause a lower portion 43A2 of the first probe 43A and a lower portion 43B2 of the second probe 43B to shift, respectively.

In some embodiments, the first guide plate 411 has a thickness, and the step shape of the first through hole 411A and the step shape of the second through hole 411B have different configurations; thus, the displacement of the first guide plate 411 causes the lower portion 43A2 of the first probe 43A and the lower portion 43B2 of the second probe 43B to shift, such that a shortest distance between the end 43A3 of the first probe 43A and the through hole 411A is equal to a shortest distance between the end 43B3 of the second probe 43B and the through hole 411B. Therefore, the shortest distance between the end 43A3 of the first probe 43A and the through hole 411A is rendered equal to the shortest distance between the end 43B3 of the second probe 43B and the through hole 411B by: (1) adjusting the thickness of the first guide plate 411; (2) controlling the displacement of the first guide plate 411 relative to the first probe 43A and the second probe 43B; (3) adjusting the configurations of the first through hole 411A and the second through hole 4111B; or any combination of (1) to (3).

Therefore, when the end 43A3 of the first probe 43A and the end 43B3 of the second probe 43B are configured to contact different target blocks defined on a single object under test, wherein the target blocks have different thicknesses, the end 43A3 of the first probe 43A and the end 43B3 of the second probe 43B have a same contact probe pressure while simultaneously in contact with the target blocks on the single object under test, by keeping the shortest distance between the end 43A3 of the first probe 43A and the through hole 411A equal to the shortest distance between the end 43B3 of the second probe 43B and the through hole 411B. Thus, by keeping the shortest distance between the end 43A3 of the first probe 43A and the through hole 411A equal to the shortest distance between the end 43B3 of the second probe 43B and the through hole 411B, the end 43A3 of the first probe 43A and the end 43B3 of the second probe 43B are in consistent contact with the target blocks on the object under test.

Figure 5A:
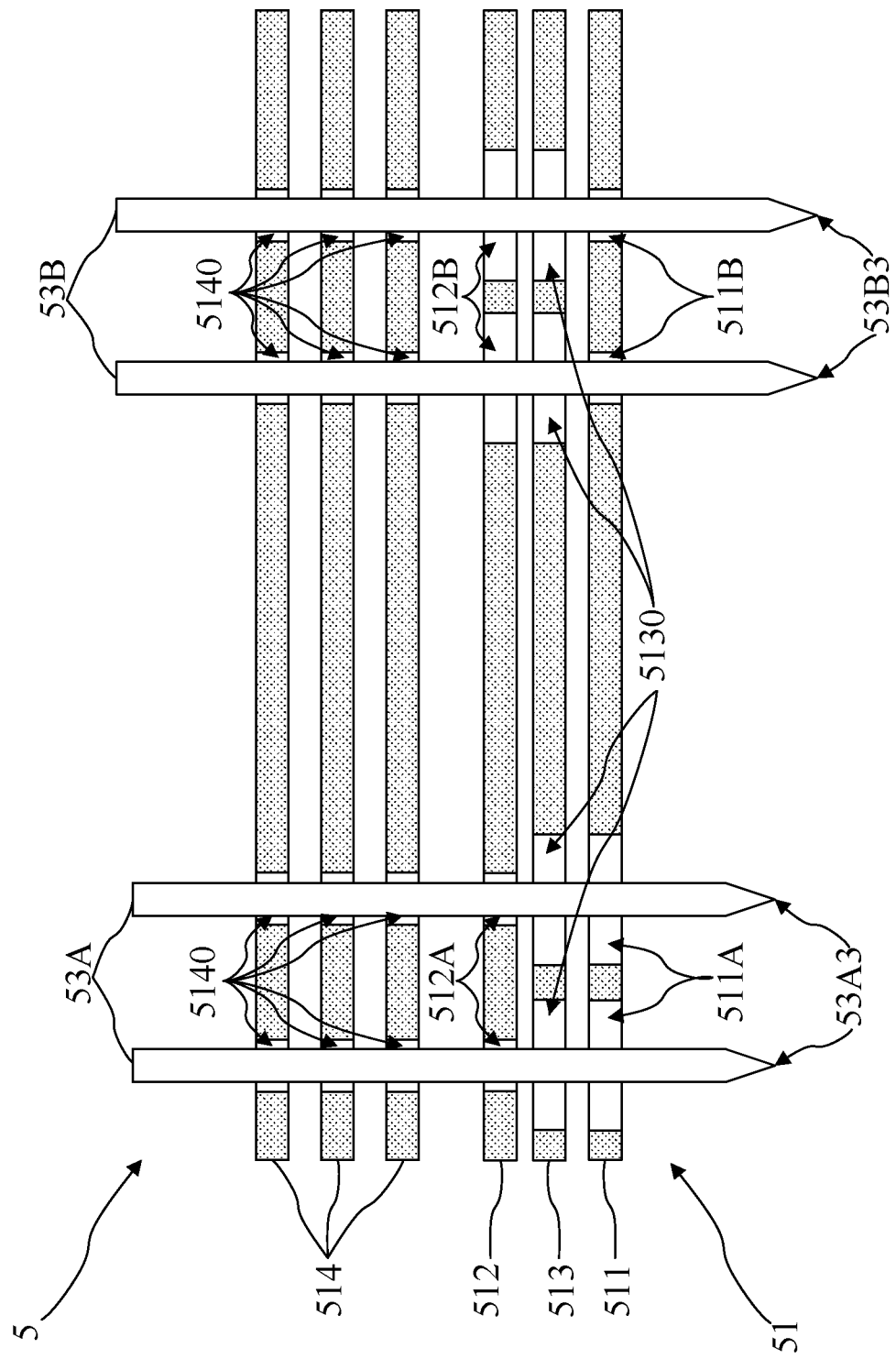
FIGS. 5A to 5D are schematic views of a probe array according to some embodiments of the disclosure.

Referring to FIG. 5A, which is a schematic view of a probe array 5 according to some embodiments of the disclosure. The probe array 5 includes a guide plate structure 51, a plurality of first probes 53A and a plurality of second probes 53B. The guide plate structure 51 includes a first guide plate 511, a second guide plate 512, at least a third guide plate 513 and at least a fourth guide plate 514. The first guide plate 511 includes a plurality of through holes 511A and a plurality of through holes 5111B. The second guide plate 512 includes a plurality of through holes 512A and a plurality of through holes 512B. Each of the through holes 511A of the first guide plate 511 and each of the through holes 512A of the second guide plate 512 receive a first probe 53A of the plurality of first probes 53A. Each of the through holes 511B of the first guide plate 511 and each of the through holes 512B of the second guide plate 512 receive a second probe 53B of the plurality of second probes 53B.

The third guide plate 513 is disposed between the first guide plate 511 and the second guide plate 512, and the third guide plate 513 includes a plurality of through holes 5130. Each of the through holes 5130 of the third guide plate 513 receives a first probe 53A or a second probe 53B. The fourth guide plate 514 includes a plurality of through holes 5140. Each of the through holes 5140 receives a first probe 53A or a second probe 53B, so as to limit ranges of motion of an upper portion 53A1 of the first probe 53A and an upper portion 53B1 of the second probe 53B.

In some embodiments, an end 53A3 of the first probe 53A and an end 53B3 of the second probe 53B are configured to contact a first block and a second block of an object under test, respectively. The first block and the second block have different thicknesses. A distance between the first guide plate 511 and the end 53A3 of the first probe 53A is less than a distance between the second guide plate 512 and the end 53A3 of the first probe 53A, and a distance between the first guide plate 511 and the end 53B3 of the second probe 53B is less than a distance between the second guide plate 512 and the end 53B3 of the second probe 53B. Thus, the first guide plate 511 is disposed between the second guide plate 512 and the end 53A3 of the first probe 53A (or the end 53B3 of the second probe 53B).

In some embodiments, the first probe 53A and the second probe 53B have different configurations (for example, length, shape, arrangement, and position in the corresponding through hole), the through holes 511A and 511B have different configurations (for example, diameter and shape), and the through holes 512A and 512B have different configurations (for example, diameter and shape). In some embodiments, a length of the first probe 53A is less than a length of the second probe 53B, a diameter of the through hole 511A is greater than a diameter of the through hole 511B, and a diameter of the through hole 512A is less than a diameter of the through hole 512B. In some embodiments, each of the first guide plate 511 and the second guide plate 512 has a cross section (e.g., along thickness direction), such that a portion of each of the through holes 511A, 511B, 512A and 512B in the cross section has a square shape or a rectangle shape. However, the disclosure is not limited thereto.

Figure 5B:
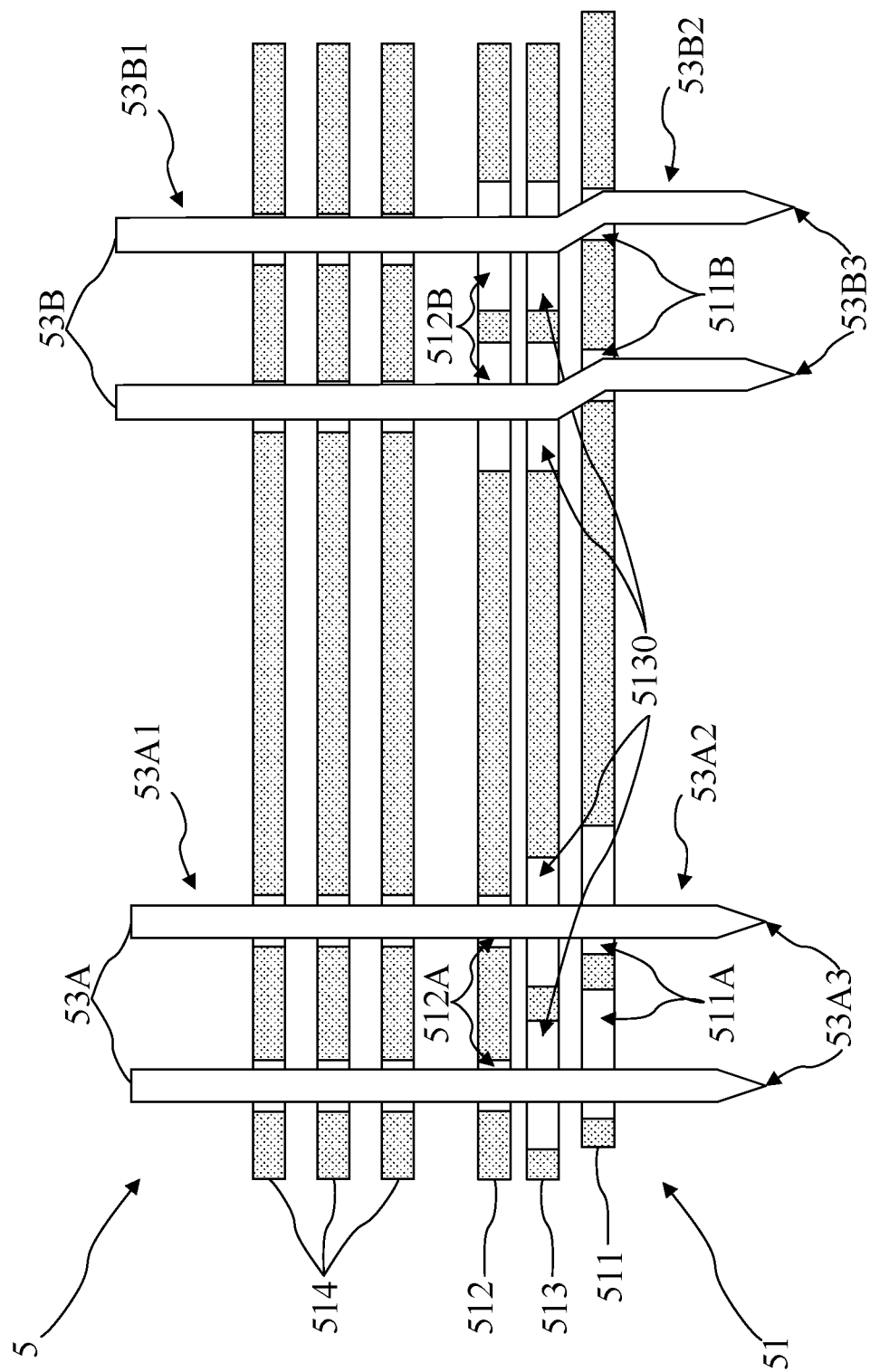

Referring to FIG. 5B, which is a schematic view of the guide plate structure 51 for guiding a probe according to some embodiments of the disclosure. The ranges of motion of the upper portion 53A1 of the first probe 53A and the upper portion 53B1 of the second probe 53B are restricted by at least a fourth guide plate 514. When the first guide plate 511 moves (for example, laterally) relative to the first probe 53A and the second probe 53B, the through hole 511B causes a lower portion 53B2 of the second probe 53B to shift, because the diameter of the through hole 511B is small.

In some embodiments, the first guide plate 511 has a thickness, and the diameter of the through hole 511A is greater than the diameter of the through hole 5111B; therefore, the displacement of the first guide plate 511 causes the lower portion 53B2 of the second probe 53B to shift, leading to a change in a difference in height between the end 53A3 of the first probe 53A and the end 53B3 of the second probe 53B. Therefore, the difference in height between the end 53A3 of the first probe 53A and the end 53B3 of the second probe 53B can be controlled by: (1) adjusting the thickness of the first guide plate 511; (2) controlling the displacement of the first guide plate 511 relative to the first probe 53A and the second probe 53B; (3) adjusting the diameter of the through hole 511A and the diameter of the through hole 511B; or any combination of (1) to (3).

Figure 5C:
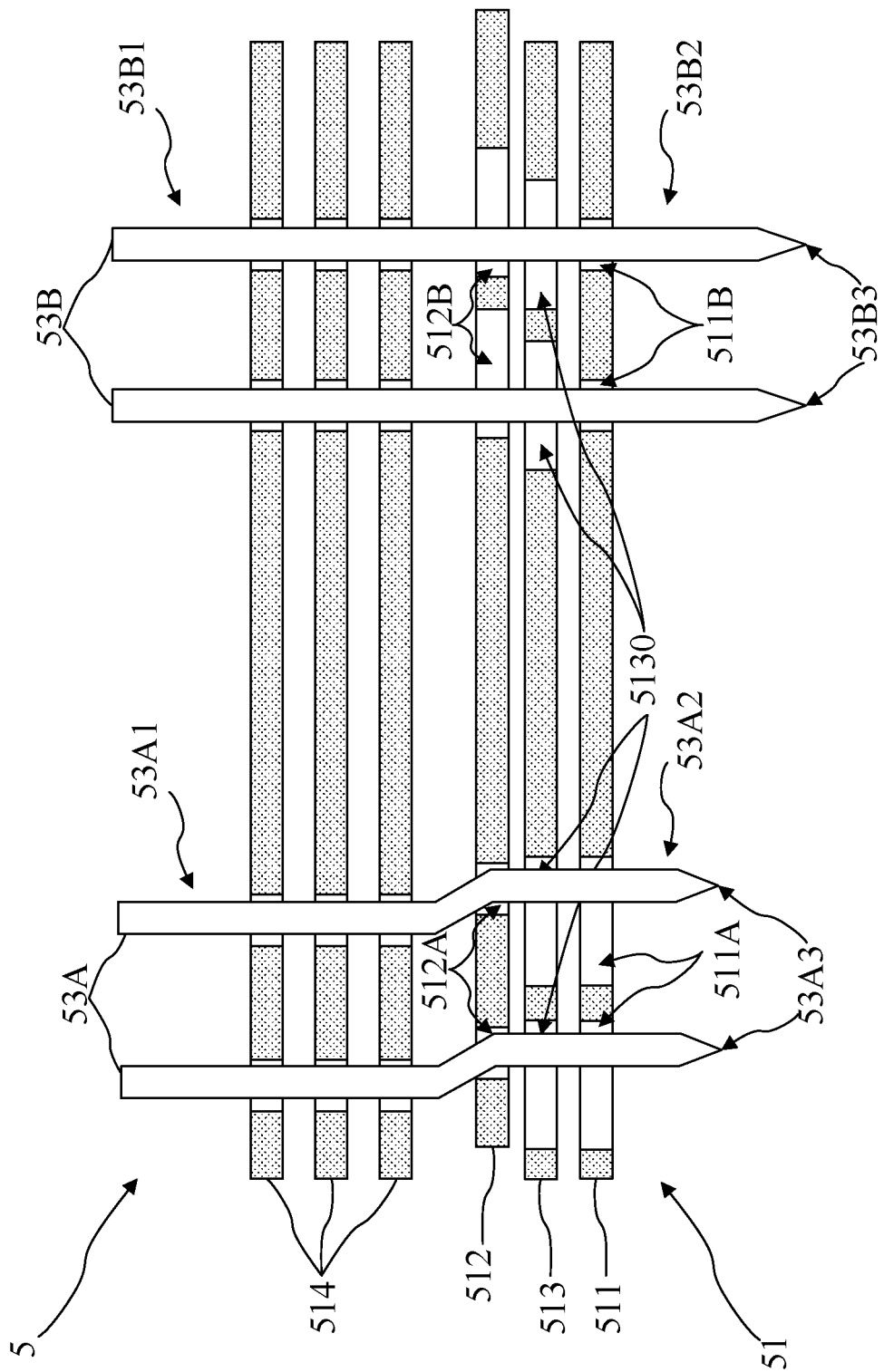

Referring to FIG. 5C, which is a schematic view of the guide plate structure 51 for guiding a probe according to some embodiments of the disclosure. When the second guide plate 512 moves (for example, laterally) relative to the first probe 53A and the second probe 53B, the through hole 512A causes the lower portion 53A2 of the first probe 53A to shift, because the diameter of the through hole 512A is small.

In some embodiments, the second guide plate 512 has a thickness, and the diameter of the through hole 512A is less than the diameter of the through hole 512B; therefore, the displacement of the second guide plate 512 causes the lower portion 53A2 of the first probe 53A to shift, leading to a change in the difference in height between the end 53A3 of the first probe 53A and the end 53B3 of the second probe 53B. Therefore, the difference in height between the end 53A3 of the first probe 53A and the end 53B3 of the second probe 53B can be controlled by: (1) adjusting the thickness of the second guide plate 512; (2) controlling the displacement of the second guide plate 512 relative to the first probe 53A and the second probe 53B; (3) adjusting the diameters of the through hole 512A and the through hole 512B; or any combination of (1) to (3).

Figure 5D:
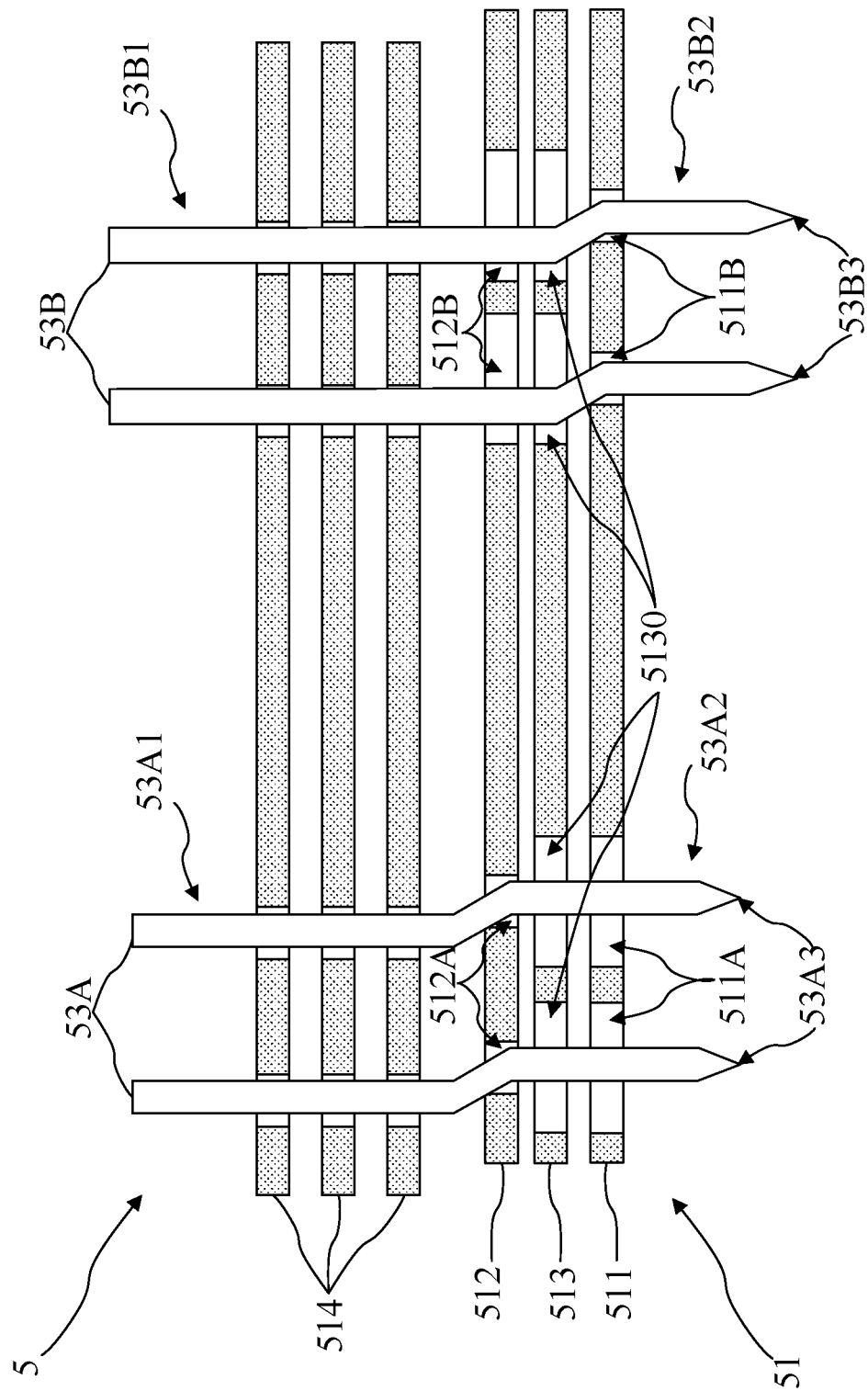

Referring to FIG. 5D, which is a schematic view of the guide plate structure 51 for guiding a probe according to some embodiments of the disclosure. When the first guide plate 511 and the second guide plate 512 move (for example, laterally) relative to the first probe 53A and the second probe 53B, the through hole 512A causes the lower portion 53A2 of the first probe 53A to shift, and the through hole 511B causes the lower portion 53B2 of the second probe 53B to shift.

In some embodiments, the first guide plate 511 and the second guide plate 512 have a thickness, such that (1) the diameter of the through hole 511A is greater than the diameter of the through hole 511B; and (2) the diameter of the through hole 512A is less than the diameter of the through hole 512B, such that the displacement of the first guide plate 511 and the displacement of the second guide plate 512 cause the lower portion 53A2 of the first probe 53A and the lower portion 53B2 of the second probe 53B to shift, thereby keeping the distance between the end 53A3 of the first probe 53A and the through hole 512A equal to the distance between the end 53B3 of the second probe 53B and the through hole 511B.

Therefore, it is feasible to keep the distance between the end 53A3 of the first probe 53A and the through hole 512A equal to the distance between the end 53B3 of the second probe 53B and the through hole 511B by: (1) adjusting the thickness of the first guide plate 511 and the thickness of the second guide plate 512; (2) controlling the displacement of the first guide plate 511 and the second guide plate 512 relative to the first probe 53A and the second probe 53B; (3) adjusting the diameters of the through holes 511A, 511B, 512A and 512B; or any combination of (1) to (3).

In some embodiments, with at least a third guide plate 513 disposed between the first guide plate 511 and the second guide plate 512, it is feasible to: (1) adjust a number of the third guide plates 513 (for example, to increase a distance between the first guide plate 511 and the second guide plate 512); and (2) adjust a configuration of the through hole 5130 of the third guide plate 513 (for example, by increasing a diameter of the through hole 5130 for receiving the first probe 53A and decreasing the diameter of the through hole 5130 for receiving the second probe 53B) in order to control the difference in height between the end 53A3 of the first probe 53A and the end 53B3 of the second probe 53B, or to keep the distance between the end 53A3 of the first probe 53A and the through hole 512A equal to the distance between the end 53B3 of the second probe 53B and the through hole 511B.

Therefore, when the end 53A3 of the first probe 53A and the end 53B3 of the second probe 53B are configured to contact the target blocks and on the object under test, wherein the target blocks have different thicknesses, the end 53A3 of the first probe 53A and the end 53B3 of the second probe 53B are made to apply a same contact probe pressure while simultaneously in consistent contact with the target blocks, by: (1) controlling the difference in height between the end 53A3 of the first probe 53A and the end 53B3 of the second probe 53B; or (2) keeping the distance between the end 53A3 of the first probe 53A and the through hole 512A equal to the distance between the end 53B3 of the second probe 53B and the through hole 511B.

The present disclosure and the advantages thereof are described in detail as above. However, it should be understood that various modifications, replacements and substitutions can be made without departing from the spirit and scope of the present disclosure as defined by the appended claims. For example, various processes described above may be implemented by different approaches, and other processes or a combination thereof may be used in substitution for the various processes described above.

Moreover, the scope of the present application is not limited to specific embodiments of the processes, machines, manufacture, substance composition, means, methods or steps provided in the detailed description. A person skilled in the art could understand from disclosure of the present application that existing or future developed processes, machines, manufacture, substance compositions, means, methods or steps that achieve the same functions or achieve substantially the same results corresponding to those of the embodiments described in the disclosure can be utilized. Accordingly, such processes, machines, manufacture, substance compositions, means, methods and steps are to be encompassed within the scope of the appended claims.

What is claimed is:

1. A guide plate structure, comprising:
a first guide plate including:
a first through hole for receiving a first probe; and
a second through hole for receiving a second probe,
wherein configurations of the first probe and the second probe are different,
wherein configurations of the first through hole and the second through hole are different,
wherein a length of the second probe is less than a length of the first probe, and a diameter of the second through hole is greater than a diameter of the first through hole;
wherein the guide plate structure further comprises:
a second guide plate, comprising:
a third through hole for receiving the first probe; and
a fourth through hole for receiving the second probe,
wherein a diameter of the third through hole is greater than a diameter of the fourth through hole,
wherein the diameter of the third through hole is greater than the diameter of the first through hole, and the diameter of the fourth through hole is less than the diameter of the second through hole.

2. The guide plate structure of claim 1, wherein an end of the first probe is configured to contact an object under test, and a distance between the first guide plate and the end of the first probe is less than a distance between the second guide plate and the end of the first probe.

3. The guide plate structure of claim 1, wherein the first guide plate has a cross section, such that a portion of the first through hole or the second through hole in the cross section has a square shape, a rectangle shape, a trapezoid shape or a step shape.

4. A guide plate structure, comprising:
a guide plate including:
a first through hole for receiving a first probe, the first probe being configured to probe a first block of an object under test; and
a second through hole for receiving a second probe, the second probe being configured to probe a second block of the object under test,
wherein configurations of the first through hole and the second through are different, and a displacement of the guide plate relative to the first probe and the second probe causes the first probe to shift and touch the first block and causes the second probe to shift and touch the second block,
wherein a length of the second probe is less than a length of the first probe, and a diameter of the second through hole is greater than a diameter of the first through hole;
wherein the guide plate structure further comprises:
a second guide plate, comprising:
a third through hole for receiving the first probe; and
a fourth through hole for receiving the second probe, wherein a diameter of the third through hole is greater than a diameter of the fourth through hole,
wherein the diameter of the third through hole is greater than the diameter of the first through hole, and the diameter of the fourth through hole is less than the diameter of the second through hole.

5. A probe array, comprising:
a first probe;
a second probe, wherein configurations of the first probe and the second probe in respect of the probe array are different; and
a first guide plate including:
a first through hole for receiving the first probe; and
a second through hole for receiving the second probe, wherein configurations of the first through hole and the second through hole in respect of the first guide plate are different,
wherein a length of the second probe is less than a length of the first probe, and a diameter of the second through hole is greater than a diameter of the first through hole;
wherein the probe array further comprises:
a second guide plate, comprising:
a third through hole for receiving the first probe and a fourth through hole for receiving the second probe, wherein a diameter of the third through hole is greater than a diameter of the fourth through hole,
wherein the diameter of the third through hole is greater than the diameter of the first through hole, and the diameter of the fourth through hole is less than the diameter of the second through hole.

6. The probe array of claim 5, wherein an end of the first probe is configured to contact an object under test, and a distance between the first guide plate and the end of the first probe is less than a distance between the second guide plate and the end of the first probe.

* * * * *